(12) United States Patent
Wang

(10) Patent No.: US 11,271,185 B2
(45) Date of Patent: Mar. 8, 2022

(54) DISPLAY STRUCTURE HAVING A DAM AND GAP

(71) Applicant: WUHAN CHINA STAR OPTOELECTRONICS SEMICONDUCTOR DISPLAY TECHNOLOGY CO., LTD., Hubei (CN)

(72) Inventor: Kan Wang, Hubei (CN)

(73) Assignee: WUHAN CHINA STAR OPTOELECTRONICS SEMICONDUCTOR DISPLAY TECHNOLOGY CO., LTD., Hubei (CN)

( * ) Notice: Subject to any disclaimer, the term of this patent is extended or adjusted under 35 U.S.C. 154(b) by 41 days.

(21) Appl. No.: 16/614,950

(22) PCT Filed: Jul. 9, 2019

(86) PCT No.: PCT/CN2019/095254
§ 371 (c)(1),
(2) Date: Nov. 19, 2019

(87) PCT Pub. No.: WO2020/173034
PCT Pub. Date: Sep. 3, 2020

(65) Prior Publication Data
US 2020/0274096 A1    Aug. 27, 2020

(30) Foreign Application Priority Data

Feb. 27, 2019   (CN) .......................... 201910147176.2

(51) Int. Cl.
*H01L 51/52*   (2006.01)
*H01L 29/66*   (2006.01)
(Continued)

(52) U.S. Cl.
CPC .......... *H01L 51/5253* (2013.01); *H01L 51/56* (2013.01); *H01L 27/3244* (2013.01);
(Continued)

(58) Field of Classification Search
CPC .......... H01L 51/56; H01L 2224/83051; H01L 51/5253; H01L 51/5237; H01L 2251/301;
(Continued)

(56) References Cited

U.S. PATENT DOCUMENTS 9,893,139 B2 *   2/2018   Kim ..................... G09G 3/3291
10,026,793 B2 *  7/2018   Jeon .................... G09G 3/3233
(Continued)

FOREIGN PATENT DOCUMENTS

CN   106816551 A   6/2017
CN   107507931 A   12/2017
(Continued)

*Primary Examiner* — Ida M Soward
(74) *Attorney, Agent, or Firm* — Mark M. Friedman

(57) ABSTRACT

A display structure is provided. The display structure includes a substrate, a dam, a first film layer, a second film layer, and a third film layer. The third film layer has a first spread rate for the first film layer, the third film layer has a second spread rate for the second film layer, and the first spread rate is less than the second spread rate. The spread rates of the third film layer on the first and second film layers are different, so as to slow the spread rate of the third film layer near an area of the dam, thereby reducing the risk that the third film layer overflows the dam, so that the encapsulation reliability of the display structure can be improved.

18 Claims, 2 Drawing Sheets

(51) Int. Cl.
*H01L 29/78* (2006.01)
*H01L 33/44* (2010.01)
*H01L 51/56* (2006.01)
H01L 27/32 (2006.01)
H01L 29/786 (2006.01)

(52) U.S. Cl.
CPC .... *H01L 29/6678* (2013.01); *H01L 29/66772* (2013.01); *H01L 29/78603* (2013.01); *H01L 33/44* (2013.01); *H01L 51/5237* (2013.01); *H01L 2227/323* (2013.01); *H01L 2251/301* (2013.01)

(58) Field of Classification Search
CPC ........... H01L 29/66772; H01L 29/6678; H01L 29/78603; H01L 33/44
See application file for complete search history.

(56) References Cited

U.S. PATENT DOCUMENTS

| | | | | |
|---|---|---|---|---|
| 10,490,610 B2* | 11/2019 | Kim | | H01L 27/322 |
| 10,522,608 B2* | 12/2019 | Park | | H01L 27/3276 |
| 10,541,381 B2* | 1/2020 | Park | | H01L 51/5253 |
| 10,622,422 B2* | 4/2020 | Liu | | H01L 51/5253 |
| 10,622,585 B2* | 4/2020 | Kim | | H01L 51/5253 |
| 10,749,137 B2* | 8/2020 | Kim | | H01L 51/5256 |
| 10,777,620 B2* | 9/2020 | Won | | G06F 3/0446 |
| 10,866,663 B2* | 12/2020 | Jun | | H01L 51/5253 |
| 10,886,346 B2* | 1/2021 | Kim | | H01L 27/1218 |
| 11,004,915 B2* | 5/2021 | Byun | | H01L 27/3258 |
| 11,063,238 B2* | 7/2021 | Lee | | H01L 51/5246 |
| 2017/0278920 A1* | 9/2017 | Park | | H01L 27/3244 |
| 2018/0033830 A1* | 2/2018 | Kim | | G06F 3/0443 |
| 2018/0226610 A1* | 8/2018 | Moon | | H01L 27/3276 |
| 2018/0226612 A1* | 8/2018 | Choi | | H01L 51/5253 |
| 2018/0287093 A1* | 10/2018 | Lee | | H01L 51/5209 |
| 2019/0207157 A1* | 7/2019 | Gong | | H01L 51/5253 |
| 2020/0058903 A1 | 2/2020 | Yin et al. | | |
| 2020/0176534 A1* | 6/2020 | Oh | | H01L 51/56 |
| 2020/0395573 A1* | 12/2020 | Zhang | | H01L 51/5256 |
| 2020/0411616 A1* | 12/2020 | Choi | | G09G 3/3225 |
| 2021/0098548 A1* | 4/2021 | Ochi | | H01L 27/3258 |
| 2021/0175464 A1* | 6/2021 | Wang | | H01L 51/5253 |

FOREIGN PATENT DOCUMENTS

| | | |
|---|---|---|
| CN | 107665062 A | 2/2018 |
| CN | 108962953 A | 12/2018 |
| CN | 109103220 A | 12/2018 |

* cited by examiner

DISPLAY STRUCTURE HAVING A DAM AND GAP

FIELD OF INVENTION

The present invention relates to a display structure, and more particularly to a display structure that improves encapsulation reliability.

BACKGROUND OF INVENTION

In recent years, organic light-emitting diode (OLED) display devices require to use a thin-film encapsulation (TFE) process to encapsulate elements in order to isolate moisture and oxygen from damaging the elements, for device reliability. Currently, one commonly used film encapsulation method is provided by stacking inorganic/organic/inorganic multilayer films, where a main function of the inorganic layer is to isolate moisture and oxygen, and a main function of the organic layer is to cover particles generated during the previous process and release stress generated when the film is bent. In order to prevent organic material of the organic layer from overflowing with an encapsulation area, resulting in an inorganic layer disposed thereon without completely covering the organic layer and the encapsulation fail, a barrier structure (dam) structure is generally formed at a bezel (i.e., the organic layer set boundary) of the OLED elements, so as to prevent the organic material from overflowing at the bezel. However, such dam still has a risk that the organic material may overflow, which leads to decrease encapsulation reliability. Furthermore, this dam design will increase a total thickness of the film encapsulation, result that affects bendability of the OLED display.

Therefore, it is necessary to provide a display structure to solve the problems in the conventional art.

TECHNICAL PROBLEM: The dam design in the conventional art still has a risk that the organic material may overflow, which leads to decrease encapsulation reliability. Furthermore, this kind of dam design will increase a total thickness of the film encapsulation, result that affects a bendability of the OLED display.

SUMMARY OF INVENTION

In view of above, the present invention is to provide a display structure, to solve an display film encapsulation problem existing in the conventional art that an organic material may overflow with an encapsulation area, result that an inorganic layer disposed thereon cannot completely cover and cannot effectively isolate moisture and oxygen, so as to cause encapsulation failure.

A primary object of the present invention is to provide a display structure, to improve an display film encapsulation problem that an organic material may overflow an encapsulation area, result that an inorganic layer disposed thereon cannot completely cover and cannot effectively isolate moisture and oxygen, so as to cause encapsulation failure.

A secondary object of the present invention is to provide a display structure, the spread rates of an organic film layer on the first and second inorganic film layers are different, so as to slow the spread rate of the organic film layer near a dam area, thereby reducing the risk that the organic film layer overflows with the dam, so that the encapsulation reliability of the display structure can be improved.

Another object of the present invention is to provide a display structure, that the organic film layer can be quickly spread on the inorganic film layer, so that an organic material of the organic film layer can be easily leveled, thereby reducing a thickness of the organic film layer, thereby reducing a total thickness of the film encapsulation structure, so as to improve the bending resistance of the film encapsulation structure. Moreover, the organic material spread more slow on the inorganic film layer at a set boundary (close to a dam area) of the organic film layer in a peripheral area of the substrate, thereby slowing the spread rate of the organic material in the vicinity of the dam area, so as to reduce the risk that the organic film layer overflows with the dam, so that increases the encapsulation reliability of the OLED display at the boundary.

In order to achieve the foregoing objects of the present invention, an embodiment of the present invention provides a display structure, including: a substrate; a dam disposed on the substrate; a first film layer disposed on the substrate and covering the dam; a second film layer disposed on the substrate, a first gap located between the second film layer and the dam; and a third film layer disposed on the substrate, the first film layer, and the second film layer, wherein when the third film layer is disposed on the first film layer and the second film layer, the third film layer is in contact with the first film layer at the first gap, and a material of the first film layer is different from a material of the second film layer.

In an embodiment of the present invention, the third film layer has a first spread rate for the first film layer, the third film layer has a second spread rate for the second film layer, and the first spread rate is less than the second spread rate.

In an embodiment of the present invention, the display structure further including: a light-emitting area disposed on the substrate, wherein the second film layer is disposed on the first film layer; and wherein the first film layer covers the light-emitting area and continuously extends across the dam, the first film layer forms a step portion at the dam, and the first gap is between a first edge of the step portion and a second edge of the second film layer.

In an embodiment of the present invention, a boundary defined by the second film layer has a distance away from a side of the dam adjacent to the second film layer, and the distance is greater than zero.

In an embodiment of the present invention, the display structure further including: a light-emitting area disposed on the substrate, wherein the first film layer covers the dam and extends toward the light-emitting area, the first film layer forms a step portion at the dam, and a second gap is located between the first film layer and the light-emitting area; and wherein the second film layer covers the light-emitting area and extends toward the first film layer, and a portion of the second film layer fills into the second gap, extends and covers on the first film layer.

In an embodiment of the present invention, the display structure further including: a light-emitting area disposed on the substrate, wherein the second film layer covers the light-emitting area and extends toward the dam, and the first gap is defined between the second film layer and the dam; and wherein the first film layer covers the dam and extends toward the light-emitting area, and a portion of the first film layer fills into the first gap and continues to extend and cover on the second film layer.

In an embodiment of the present invention, the display structure further including: a light-emitting area disposed on the substrate, wherein the first film layer covers the light-emitting area and continuously extends across the dam, and the first film layer forms a step portion at the dam; wherein the second film layer is an oxygen-containing layer formed by treating the first film layer an oxygen ion treatment process, and the second film layer completely covers the light-emitting area; and wherein the first gap is between a first edge of the step portion and a second edge of the second film layer.

Moreover, another embodiment of the present invention further provides a display structure, including: a substrate; a dam disposed on the substrate; a first film layer disposed on the substrate; and a second film layer disposed on the substrate, a first gap located between the second film layer and the dam, wherein the first film layer has a first oxygen content, the second film layer has a second oxygen content, and the second oxygen content is greater than the first oxygen content.

In an embodiment of the present invention, the display structure further including: a light-emitting area disposed on the substrate, wherein the second film layer is disposed on the first film layer; and wherein the first film layer covers the light-emitting area and continuously extends across the dam, the first film layer forms a step portion at the dam, and the first gap is between a first edge of the step portion and a second edge of the second film layer.

In an embodiment of the present invention, a boundary defined by the second film layer has a distance away from a side of the dam adjacent to the second film layer, and the distance is greater than zero.

In an embodiment of the present invention, the display structure further including: a light-emitting area disposed on the substrate, wherein the first film layer covers the dam and extends toward the light-emitting area, the first film layer forms a step portion at the dam, and a second gap is located between the first film layer and the light-emitting area; and wherein the second film layer covers the light-emitting area and extends toward the first film layer, and a portion of the second film layer fills into the second gap, extends and covers on the first film layer.

In an embodiment of the present invention, the display structure further including: a light-emitting area disposed on the substrate, wherein the second film layer covers the light-emitting area and extends toward the dam, and the first gap is defined between the second film layer and the dam; and wherein the first film layer covers the dam and extends toward the light-emitting area, and a portion of the first film layer fills into the first gap and continues to extend and cover on the second film layer.

In an embodiment of the present invention, the display structure further including: a light-emitting area disposed on the substrate, wherein the first film layer covers the light-emitting area and continuously extends across the dam, and the first film layer forms a step portion at the dam; wherein the second film layer is an oxygen-containing layer formed by treating the first film layer an oxygen ion treatment process, and the second film layer completely covers the light-emitting area; and wherein the first gap is between a first edge of the step portion and a second edge of the second film layer.

Furthermore, yet another embodiment of the present invention provides a display structure, including: a substrate; a dam disposed on the substrate; a first film layer disposed on the substrate and covering the dam; a second film layer disposed on the substrate, a first gap located between the second film layer and the dam; and a third film layer disposed on the substrate, the first film layer, and the second film layer, wherein when the third film layer is disposed on the first film layer and the second film layer, the third film layer has a first spread rate for the first film layer, the third film layer has a second spread rate for the second film layer, and the first spread rate is less than the second spread rate.

In an embodiment of the present invention, the display structure further including: a light-emitting area disposed on the substrate, wherein the second film layer is disposed on the first film layer; and wherein the first film layer covers the light-emitting area and continuously extends across the dam, the first film layer forms a step portion at the dam, and the first gap is between a first edge of the step portion and a second edge of the second film layer.

In an embodiment of the present invention, a boundary defined by the second film layer has a distance away from a side of the dam adjacent to the second film layer, and the distance is greater than zero.

In an embodiment of the present invention, the display structure further including: a light-emitting area disposed on the substrate, wherein the first film layer covers the dam and extends toward the light-emitting area, the first film layer forms a step portion at the dam, and a second gap is located between the first film layer and the light-emitting area; and wherein the second film layer covers the light-emitting area and extends toward the first film layer, and a portion of the second film layer fills into the second gap, extends and covers on the first film layer.

In an embodiment of the present invention, the display structure further including: a light-emitting area disposed on the substrate, wherein the second film layer covers the light-emitting area and extends toward the dam, and the first gap is defined between the second film layer and the dam; and wherein the first film layer covers the dam and extends toward the light-emitting area, and a portion of the first film layer fills into the first gap and continues to extend and cover on the second film layer.

In an embodiment of the present invention, the display structure further including: a light-emitting area disposed on the substrate, wherein the first film layer covers the light-emitting area and continuously extends across the dam, and the first film layer forms a step portion at the dam; wherein the second film layer is an oxygen-containing layer formed by treating the first film layer an oxygen ion treatment process, and the second film layer completely covers the light-emitting area; and wherein the first gap is between a first edge of the step portion and a second edge of the second film layer.

BENEFICIAL EFFECT: Compared with the conventional art, the display structure of the present invention is by providing that the spread rates of the organic film layer on the first and second inorganic film layers are different, so as to slow the spread rate of the organic film layer near an area of the dam, thereby reducing the risk that the organic film layer overflows with the dam, so that the encapsulation reliability of the display structure can be improved. Moreover, the display structure of the present invention provides that the organic film layer can be quickly spread on the inorganic film layer, so that an organic material of the organic film layer can be easily leveled, thereby reducing a thickness of the organic film layer, thereby reducing a total thickness of the film encapsulation structure, so as to improve the bending resistance of the film encapsulation structure. Furthermore, the organic material spread more slow on the inorganic film layer at a setting boundary (close to a dam area) of the organic film layer in the peripheral area of the substrate, thereby slowing the spread rate of the organic material in the vicinity of the dam area, so as to reduce the risk that the organic film layer overflows with the dam, so that increases the encapsulation reliability of the OLED display at the boundary.

DRAWINGS

In order to make the above description of the present invention more comprehensible, the preferred embodiments are described below, and in conjunction with the accompanying drawings, the detailed description is as follows.

DETAILED DESCRIPTION OF EMBODIMENTS

The following description of the various embodiments is provided to illustrate the specific embodiments of the invention.

Furthermore, the directional terms mentioned in the present invention, such as upper, lower, top, bottom, front, rear, left, right, inner, outer, side, surrounding, central, lateral, horizontal, vertical, longitudinal, axial, radial, uppermost or lowermost, etc., only refer to the direction of the additional schema. Therefore, the directional terminology used herein is for the purpose of illustration and understanding of the invention.

Figure 1:
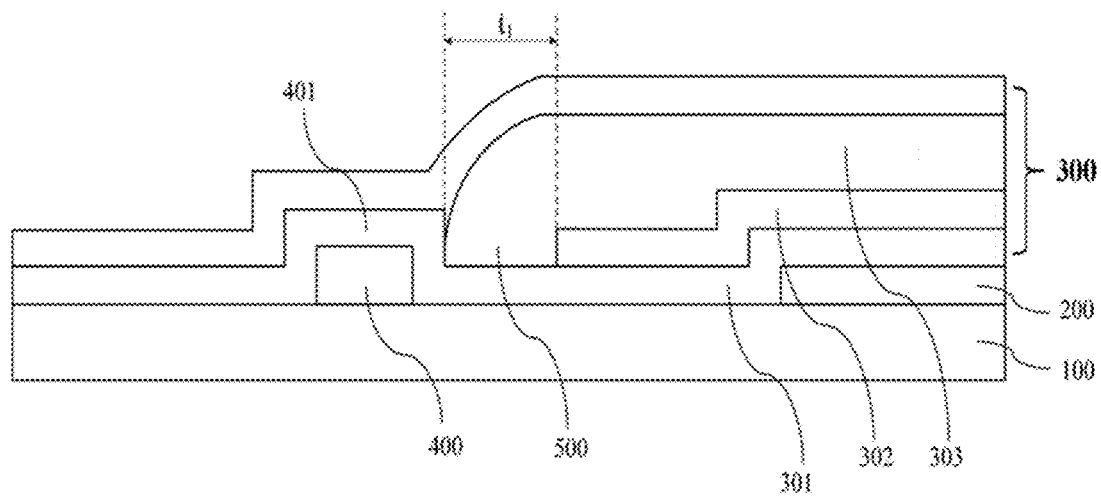
FIG. 1 illustrates a schematic cross-sectional view of a display structure according to a first embodiment of the present invention.

Please refer to FIG. 1, in order to achieve the aforementioned objects of the present invention, a display structure is provided. The display structure includes: a substrate 100, a dam 400, a first film layer 301, a second film layer 302, and a third film layer 303. The dam 400 disposed on the substrate 100. The first film layer 301 is disposed on the substrate 100 and covering the dam 400. The second film layer 302 is disposed on the substrate 100, a first gap 500 located between the second film layer 302 and the dam 400. The third film layer 303 is disposed on the substrate 100, the first film layer 301, and the second film layer 302, when the third film layer 303 is disposed on the first film layer 301 and the second film layer 302, the third film layer 303 has a first spread rate for the first film layer 301, the third film layer 303 has a second spread rate for the second film layer 302, and the first spread rate is less than the second spread rate.

The present invention will hereinafter be described the detailed construction, assembly relationship, and operation principle of the above-described respective elements of a first embodiment of FIG. 1 in detail.

FIG. 1 illustrates a schematic cross-sectional view of a display structure according to the first embodiment of the present invention. The display structure includes: the substrate 100, the dam 400, the first film layer 301, the second film layer 302, and the third film layer 303. Optionally, multi-film encapsulation layers 300 can be the first film layer 301, the second film layer 302, the third film layer 303, and a fourth film layer. The substrate 100 can be a flexible substrate, such as a polyimide substrate. Alternatively, the substrate 100 may be a rigid substrate 100 on which a flexible film layer is disposed. For example, a glass substrate 100 has a polyimide film layer disposed thereon. The display device layer includes a light-emitting area 200 disposed on the substrate 100, and the light-emitting area 200 has, for example, a plurality of OLED elements. Alternatively, the display device layer includes an active area disposed on the substrate 100, the active area has a plurality of display elements (e.g., a plurality of thin-film transistors). The dam 400 disposed on the substrate 100. Optionally, the dam 400 is disposed on the substrate 100 by inkjet printing through an ink material. Preferably, the dam 400 disposes outside the light-emitting area 200 and surrounds the light-emitting area 200. The first film layer 301 is disposed on the substrate 100 and covering the dam 400. Preferably, the first film layer 301 is a first inorganic film layer. Preferably, the first film layer 301 completely covers the light-emitting area 200 and continuously extends across the dam 400, and the first film layer 301 forms a step portion 401 at the dam 400. Optionally, the first film layer 301 is formed by a process such as chemical vapor deposition (CVD), atomic layer deposition (ALD), or the like. Optionally, a material of the first film layer 301 is selected from a group consisting of SiNx, SiOxNy, and AlOx. The second film layer 302 disposed on the substrate 100. Optionally, the second film layer 302 is disposed on the first film layer 301. Optionally, the second film layer 302 completely covers the light-emitting area and extends toward the dam 400. A first gap 500 is located between the second film layer 302 and the dam 400, the first gap 500 is between a first edge of the step portion 401 and a second edge of the second film layer 302. In other word, a boundary defined by the second film layer 302 still has a distance away from a side of the dam 400 adjacent to the second film layer 302, and the distance is greater than zero. Preferably, the second film layer 302 is a second inorganic layer. Optionally, the second film layer 302 is formed by processes such as chemical vapor deposition (CVD), atomic layer deposition (ALD), and sputtering. Optionally, a material of the second film layer 302 is selected from a group consisting of SiOxNy, SiOx, and AlOx. The third film layer 303 is disposed on the substrate 100, the first film layer 301, and the second film layer 302, when the third film layer 303 is disposed on the first film layer 301 and the second film layer 302, when the third film layer is disposed on the first film layer and the second film layer, the third film layer is in contact with the first film layer at the first gap, and a material of the first film layer is different from a material of the second film layer. The third film layer 303 has a first spread rate for the first film layer 301, the third film layer 303 has a second spread rate for the second film layer 302, and the first spread rate is less than the second spread rate. Therefore, when the third film layer 303 is on the second film layer 302, the material of the third film layer 303 can be rapidly spread, so that the material of the third film layer 303 can be quickly leveled, and thus a thickness of the third film layer 303 is reduced. On the other hand, when the third film layer 303 is on the first film layer 301, because the spread rate of the material of the third film layer 303 on the first film layer 301 is slow, so the spread rate of the material of the third film layer 303 is slow down near an area of dam 400, thereby reducing the risk of material of the third film layer 303 overflowing over the dam 400. Preferably, the third film layer 303 disposed on the substrate 100, the first film layer 301, and the second film layer 302 is formed by inkjet printing process. Optionally, the third film layer 303 completely covers the second film layer 302 and extends and fills into the first gap 500. Optionally, the third film layer 303 is in contact with the first edge of the step portion 401. Optionally, the fourth film layer covers the third film layer 303 and the first film layer 302. Preferably, the fourth film layer completely covers the light-emitting area 200, the dam 400, the third film layer 303, and the first film layer 301. Optionally, the fourth film layer is formed by processes such as chemical vapor deposition (CVD), atomic layer deposition (ALD), and sputtering. Optionally, a material of the fourth film layer is selected from a group consisting of SiNx, SiOxNy, and AlOx.

Figure 2:
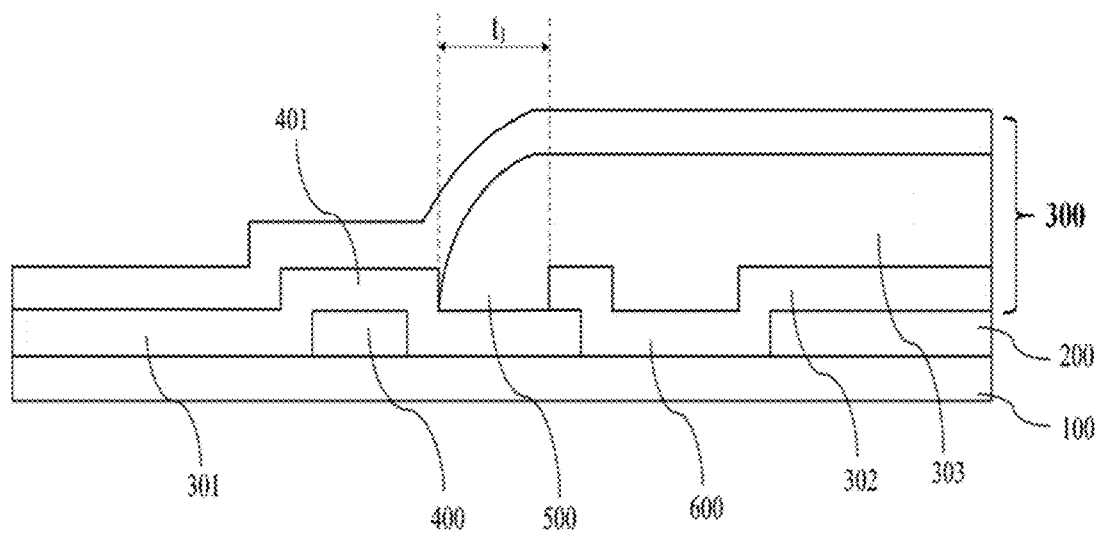
FIG. 2 illustrates a schematic cross-sectional view of a display structure according to a second embodiment of the present invention.

Then, please refer to FIG. 2, FIG. 2 illustrates a schematic cross-sectional view of a display structure according to the second embodiment of the present invention. The display structure of the second embodiment of the present invention is substantially the same as that of the first embodiment, and the differences are: the first film layer 301 covers the dam 400 and extends toward the light-emitting area 200, the first film layer 301 forms a step portion at the dam 400, and a second gap 600 is located between the first film layer 301 and the light-emitting area 200; and the second film layer 302 covers the light-emitting area 200 and extends toward the first film layer 301, and a portion of the second film layer 302 fills into the second gap 600, extends and covers on the first film layer 301. In other words, in the display structure of the second embodiment of the present invention, the first film layer 301 does not cover the light-emitting area 200, so that the second gap 600 is between the light-emitting area 200 and the first film layer 301. Next, the second film layer 302 covers the light-emitting area 200, continuously extends and fills into the second gap 600, and extends and partially covers the first film layer 301. Therefore, when the third film layer 303 is on the second film layer 302, the material of the third film layer 303 can still be rapidly spread, so that the material of the third film layer 303 can be quickly leveled, and thus a thickness of the third film layer 303 is reduced. On the other hand, when the third film layer 303 flows through the second film layer 302 and flows to the first film layer 301, because the spread rate of the material of the third film layer 303 on the first film layer 301 is slow, so the spread rate of the material of the third film layer 303 is slow down near an area of dam 400, thereby reducing the risk of material of the third film layer 303 overflowing over the dam 400.

Figure 3:
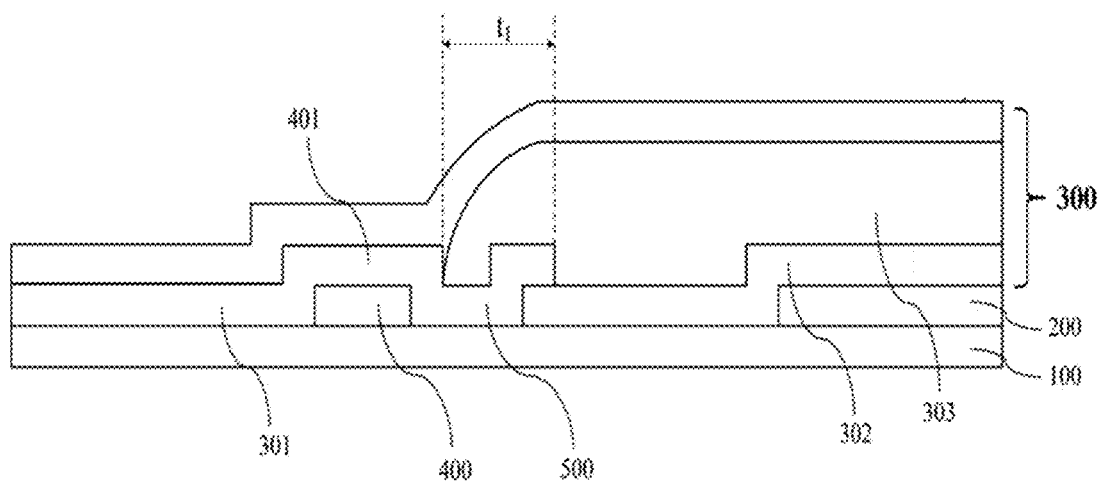
FIG. 3 illustrates a schematic cross-sectional view of a display structure according to a third embodiment of the present invention.

Please refer to FIG. 3, FIG. 3 illustrates a schematic cross-sectional view of a display structure according to the third embodiment of the present invention. The display structure of the third embodiment of the present invention is substantially the same as that of the second embodiment, and the differences are: the second film layer 302 covers the light-emitting area 200 and extends toward the dam 400, and the first gap 500 is defined between the second film layer 302 and the dam 400; and the first film layer 301 covers the dam 400 and extends toward the light-emitting area 200, and a portion of the first film layer 301 fills into the first gap 500 and continues to extend and cover on the second film layer 302. In other words, in the display structure of the third embodiment of the present invention, the second film layer 302 is formed before the first film layer 301, and a portion of the first film layer 301 covers on the second film layer 302. A third gap is defined between the first film layer 301 and the light-emitting area 200. Therefore, when the third film layer 303 is on the second film layer 302, the material of the third film layer 303 can still be rapidly spread, so that the material of the third film layer 303 can be quickly leveled, and thus a thickness of the third film layer 303 is reduced. On the other hand, when the third film layer 303 flows to the first film layer 301 covered on the second film layer 302, because the spread rate of the material of the third film layer 303 on the first film layer 301 is slow, so the spread rate of the material of the third film layer 303 is slow down near an area of dam 400, thereby reducing the risk of material of the third film layer 303 overflowing over the dam 400.

Figure 4:
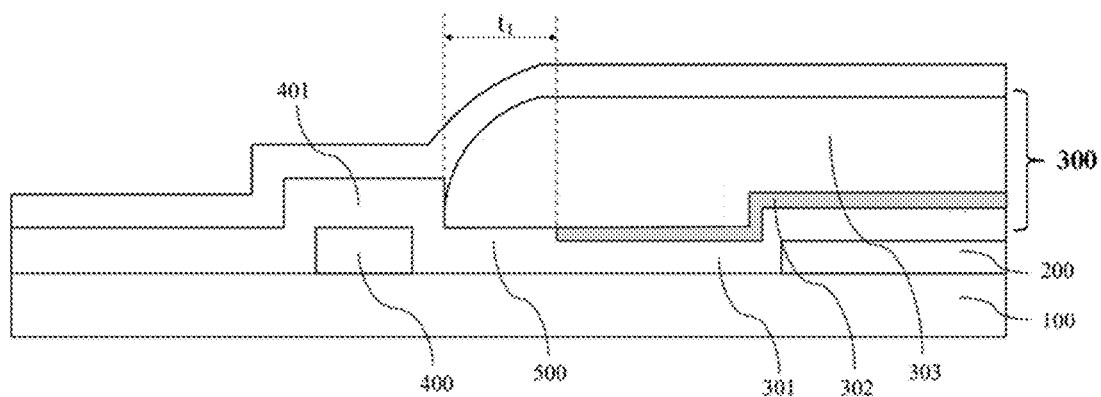
FIG. 4 illustrates a schematic cross-sectional view of a display structure according to a fourth embodiment of the present invention.

Please refer to FIG. 4, FIG. 4 illustrates a schematic cross-sectional view of a display structure according to the fourth embodiment of the present invention. The display structure of the fourth embodiment of the present invention is substantially the same as that of the first embodiment, and the differences are: the first film layer 301 covers the light-emitting area 200 and continuously extends across the dam 400, and the first film layer 301 forms a step portion 401 at the dam 400; the second film layer 302 is an oxygen-containing layer formed by treating the first film layer 301 an oxygen ion treatment process, and the second film layer 302 completely covers the light-emitting area 200; and the first gap 500 is between a first edge of the step portion 401 and a second edge of the second film layer 302. In other words, in the display structure of the fourth embodiment of the present invention, the second film layer 302 is formed by treating a portion of the first film layer 301 an oxygen ion treatment instead, it is not additionally provided with an inorganic layer on the first film layer 301.

Furthermore, yet another embodiment of the present invention further provides a display structure, including: a substrate; a dam disposed on the substrate; a first film layer disposed on the substrate; and a second film layer disposed on the substrate, a first gap located between the second film layer and the dam, wherein the first film layer has a first oxygen content, the second film layer has a second oxygen content, and the second oxygen content is greater than the first oxygen content.

Optionally, the display structure further including: a light-emitting area disposed on the substrate, wherein the second film layer is disposed on the first film layer; and the first film layer covers the light-emitting area and continuously extends across the dam, the first film layer forms a step portion at the dam, and the first gap is between a first edge of the step portion and a second edge of the second film layer.

Alternatively, the display structure further including: a light-emitting area disposed on the substrate. The first film layer covers the dam and extends toward the light-emitting area, the first film layer forms a step portion at the dam, and a second gap is located between the first film layer and the light-emitting area; and the second film layer covers the light-emitting area and extends toward the first film layer, and a portion of the second film layer fills into the second gap, extends and covers on the first film layer.

Alternatively, the display structure further including: a light-emitting area disposed on the substrate. The second film layer covers the light-emitting area and extends toward the dam, and the first gap is defined between the second film layer and the dam; and wherein the first film layer covers the dam and extends toward the light-emitting area, and a portion of the first film layer fills into the first gap and continues to extend and cover on the second film layer.

Alternatively, the display structure further including: a light-emitting area disposed on the substrate. The first film layer covers the light-emitting area and continuously extends across the dam, and the first film layer forms a step portion at the dam; wherein the second film layer is an oxygen-containing layer formed by treating the first film layer an oxygen ion treatment process, and the second film layer completely covers the light-emitting area; and wherein the first gap is between a first edge of the step portion and a second edge of the second film layer.

As described above, compared with the existing display film encapsulation problem that the organic material may overflow the encapsulation area, result that the inorganic layer disposed thereon cannot completely cover and cannot effectively isolate moisture and oxygen to cause encapsulation failure.

The display structure of the present invention is by providing that the display structure of the present invention is that the diffusion rates of the organic film layer on the first and second inorganic film layers are different, so as to slow the diffusion rate of the organic film layer near an area of the dam, thereby reducing the risk that the organic film layer overflows the dam, so that the encapsulation reliability of the display structure can be improved.

The display structure of the present invention provides that the organic film layer can be quickly spread on the inorganic film layer, so that an organic material of the organic film layer can be easily leveled, thereby reducing a thickness of the organic film layer, thereby reducing a total thickness of the film encapsulation structure, so as to improve the bending resistance of the film encapsulation structure.

Moreover, the organic material spread slowly on the inorganic film layer at a setting boundary (close to a dam area) of the organic film layer in the peripheral area of the substrate, thereby slowing the spread rate of the organic material in the vicinity of the dam area, so as to reduce the risk that the organic film layer overflows with the dam, so that increases the encapsulation reliability of the OLED display at the boundary.

The display structure of the present invention further makes the first inorganic film layer to have a first oxygen content;

and the second inorganic film layer has a second oxygen content. The second oxygen content is greater than the first oxygen content, thereby reducing the risk that the organic film layer overflows with the dam, so as to improve the encapsulation reliability of the display structure.

The present invention has been described by the above related embodiments, but the above embodiments are merely examples for implementing the present invention.

It must be noted that the disclosed embodiments do not intend to limit the scope of the invention.

Conversely, modifications and equivalent arrangements are intended to be included within the scope of the invention.

The invention claimed is:

1. A display structure, comprising:
   a substrate;
   a dam disposed on the substrate;
   a first film layer disposed on the substrate and covering the dam;
   a second film layer disposed on the substrate, a first gap located between the second film layer and the dam; and
   a third film layer disposed on the substrate, the first film layer, and the second film layer,
   wherein when the third film layer is disposed on the first film layer and the second film layer, the third film layer is in contact with the first film layer at the first gap, and a material of the first film layer is different from a material of the second film layer,
   wherein the third film layer has a first spread rate for the first film layer, the third film layer has a second spread rate for second film layer, and the first spread rate is less than the second spread rate.

2. The display structure according to claim 1, further comprising:
   a light-emitting area disposed on the substrate,
   wherein the second film layer is disposed on the first film layer; and
   wherein the first film layer covers the light-emitting area and continuously extends across the dam, the first film layer forms a step portion at the dam, and the first gap is between a first edge of the step portion and a second edge of the second film layer.

3. The display structure according to claim 2, wherein a boundary defined by the second film layer has a distance away from a side of the dam adjacent to the second film layer, and the distance is greater than zero.

4. The display structure according to claim 1, further comprising:
   a light-emitting area disposed on the substrate,
   wherein the first film layer covers the dam and extends toward the light-emitting area, the first film layer forms a step portion at the dam, and a second gap is located between the first film layer and the light-emitting area; and
   wherein the second film layer covers the light-emitting area and extends toward the first film layer, and a portion of the second film layer fills into the second gap, extends and covers on the first film layer.

5. The display structure according to claim 1, further comprising:
   a light-emitting area disposed on the substrate,
   wherein the second film layer covers the light-emitting area and extends toward the dam, and the first gap is defined between the second film layer and the dam; and
   wherein the first film layer covers the dam and extends toward the light-emitting area, and a portion of the first film layer fills into the first gap and continues to extend and cover on the second film layer.

6. The display structure according to claim 1, further comprising:
   a light-emitting area disposed on the substrate,
   wherein the first film layer covers the light-emitting area and continuously extends across the dam, and the first film layer forms a step portion at the dam;
   wherein the second film layer is an oxygen-containing layer formed by treating the first film layer an oxygen ion treatment process, and the second film layer completely covers the light-emitting area; and
   wherein the first gap is between a first edge of the step portion and a second edge of the second film layer.

7. A display structure, comprising:
   a substrate;
   a dam disposed on the substrate;
   a first film layer disposed on the substrate; and
   a second film layer disposed on the substrate, a first gap located between the second film layer and the dam,
   wherein the first film layer has a first oxygen content, the second film layer has a second oxygen content, and the second oxygen content is greater than the first oxygen content.

8. The display structure according to claim 7, further comprising:
   a light-emitting area disposed on the substrate,
   wherein the second film layer is disposed on the first film layer; and
   wherein the first film layer covers the light-emitting area and continuously extends across the dam, the first film layer forms a step portion at the dam, and the first gap is between a first edge of the step portion and a second edge of the second film layer.

9. The display structure according to claim 8, wherein a boundary defined by the second film layer has a distance away from a side of the dam adjacent to the second film layer, and the distance is greater than zero.

10. The display structure according to claim 7, further comprising:
    a light-emitting area disposed on the substrate,
    wherein the first film layer covers the dam and extends toward the light-emitting area, the first film layer forms a step portion at the dam, and a second gap is located between the first film layer and the light-emitting area; and wherein the second film layer covers the light-emitting area and extends toward the first film layer, and a portion of the second film layer fills into the second gap, extends and covers on the first film layer.

11. The display structure according to claim 7, further comprising:

a light-emitting area disposed on the substrate, wherein the second film layer covers the light-emitting area and extends toward the dam, and the first gap is defined between the second film layer and the dam; and wherein the first film layer covers the dam and extends toward the light-emitting area, and a portion of the first film layer fills into the first gap and continues to extend and cover on the second film layer.

12. The display structure according to claim 7, further comprising:

a light-emitting area disposed on the substrate, wherein the first film layer covers the light-emitting area and continuously extends across the dam, and the first film layer forms a step portion at the dam;

wherein the second film layer is an oxygen-containing layer formed by treating the first film layer an oxygen ion treatment process, and the second film layer completely covers the light-emitting area; and wherein the first gap is between a first edge of the step portion and a second edge of the second film layer.

13. A display structure, comprising:

a substrate;

a dam disposed on the substrate;

a first film layer disposed on the substrate and covering the dam;

a second film layer disposed on the substrate, a first gap located between the second film layer and the dam; and a third film layer disposed on the substrate, the first film layer, and the second film layer, wherein when the third film layer is disposed on the first film layer and the second film layer, the third film layer has a first spread rate for the first film layer, the third film layer has a second spread rate for the second film layer, and the first spread rate is less than the second spread rate.

14. The display structure according to claim 13, further comprising:

a light-emitting area disposed on the substrate, wherein the second film layer is disposed on the first film layer; and wherein the first film layer covers the light-emitting area and continuously extends across the dam, the first film layer forms a step portion at the dam, and the first gap is between a first edge of the step portion and a second edge of the second film layer.

15. The display structure according to claim 14, wherein a boundary defined by the second film layer has a distance away from a side of the dam adjacent to the second film layer, and the distance is greater than zero.

16. The display structure according to claim 13, further comprising:

a light-emitting area disposed on the substrate, wherein the first film layer covers the dam and extends toward the light-emitting area, the first film layer forms a step portion at the dam, and a second gap is located between the first film layer and the light-emitting area; and wherein the second film layer covers the light-emitting area and extends toward the first film layer, and a portion of the second film layer fills into the second gap, extends and covers on the first film layer.

17. The display structure according to claim 13, further comprising:

a light-emitting area disposed on the substrate, wherein the second film layer covers the light-emitting area and extends toward the dam, and the first gap is defined between the second film layer and the dam; and wherein the first film layer covers the dam and extends toward the light-emitting area, and a portion of the first film layer fills into the first gap and continues to extend and cover on the second film layer.

18. The display structure according to claim 13, further comprising:

a light-emitting area disposed on the substrate, wherein the first film layer covers the light-emitting area and continuously extends across the dam, and the first film layer forms a step portion at the dam;

wherein the second film layer is an oxygen-containing layer formed by treating the first film layer an oxygen ion treatment process, and the second film layer completely covers the light-emitting area; and wherein the first gap is between a first edge of the step portion and a second edge of the second film layer.

* * * * *